(12) United States Patent
Yang et al.

(10) Patent No.: US 10,554,246 B2
(45) Date of Patent: Feb. 4, 2020

(54) METHOD AND APPARATUS FOR BROADBAND HIGH-ISOLATION CIRCULATOR FOR SIMULTANEOUS TRANSMIT AND RECEIVE SYSTEMS

(71) Applicant: Intel Corporation, Santa Clara, CA (US)

(72) Inventors: Tae Young Yang, Portland, OR (US); Eduardo X. Alban, Hillsboro, OR (US); Yang-Seok Choi, Portland, OR (US); Timo Huusari, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/941,446

(22) Filed: Mar. 30, 2018

(65) Prior Publication Data
US 2019/0305814 A1    Oct. 3, 2019

(51) Int. Cl.
| | |
|---|---|
| *H01P 1/38* | (2006.01) |
| *H04B 1/525* | (2015.01) |
| *H04B 1/56* | (2006.01) |
| *H01P 1/387* | (2006.01) |
| *H04B 1/403* | (2015.01) |

(52) U.S. Cl.
CPC .............. *H04B 1/56* (2013.01); *H01P 1/387* (2013.01); *H04B 1/403* (2013.01); *H04B 1/525* (2013.01)

(58) Field of Classification Search
CPC .. H01P 1/38; H01P 1/387; H04B 1/56; H04B 1/403; H04B 1/525
USPC ........................................................ 455/83
See application file for complete search history.

(56) References Cited

U.S. PATENT DOCUMENTS

| | | | | |
|---|---|---|---|---|
| 4,791,421 | A * | 12/1988 | Morse | ...................... H01Q 3/26 342/368 |
| 4,951,060 | A * | 8/1990 | Cohn | ................. H01Q 21/0025 342/175 |
| 6,611,180 | B1 * | 8/2003 | Puzella | ................... H01P 1/387 333/1.1 |
| 7,373,115 | B2 * | 5/2008 | Monroe | .................... H01P 1/15 333/101 |
| 2014/0128008 | A1 | 5/2014 | Cox et al. | |
| 2014/0194074 | A1 | 7/2014 | Klomsdorf et al. | |

(Continued)

OTHER PUBLICATIONS

Search Report dated May 9, 2019 for PCT Application No. PCT/US19/16996.

*Primary Examiner* — Lee Nguyen
(74) *Attorney, Agent, or Firm* — Schiff Hardin LLP

(57) ABSTRACT

A circulator system for use in a simultaneous transmit and receive system includes a transmitter port connected to a first port of a circulator component by a phase shifter and possibly a pre-conditioning impedance, an antenna port connected to a second port of the circulator component by a pre-conditioning impedance, and a receiver port connected to a third port of the circulator component by a phase shifter and a pre-conditioning impedance. A loop with an impedance is connected between the transmitter port and the receiver port. A double loop circulator system includes further phase shifters and impedances at the first and third ports of the circulator component and a second loop with an impedance connected signal paths for the transmitter and receiver ports, being connected between the phase shifters in the signal paths. High isolation between the transmitter and receiver ports is provided.

10 Claims, 16 Drawing Sheets

(56) References Cited

U.S. PATENT DOCUMENTS

2017/0070203 A1 3/2017 Schmidhammer
2017/0070217 A1 3/2017 Mandegaran
2017/0170999 A1 6/2017 Zhou et al.

* cited by examiner

METHOD AND APPARATUS FOR BROADBAND HIGH-ISOLATION CIRCULATOR FOR SIMULTANEOUS TRANSMIT AND RECEIVE SYSTEMS

TECHNICAL FIELD

The present disclosure relates generally to a method and apparatus for simultaneous transmit and receive system, and more particularly to a method and apparatus for simultaneous transmitting and receiving data in a wireless communication system.

BACKGROUND

There is a strong demand in the market to have a practical solution for a broadband high-isolation circulator enabling Simultaneous Transmit and Receive (STAR) systems for emerging wireless communication and radar applications.

The electromagnetic spectrum is extremely valuable to users. In a recent auction of spectrum for wireless services, companies bid substantial amounts for access to the wireless spectrum for advanced wireless services. STAR (simultaneous transmit and receive) systems can double the spectral efficiency by allowing simultaneous data transmission and reception at the same frequency band at the same time. Applications for use of STAR systems include, but are not limited to, 5G-and-beyond wireless communications, radar in autonomous vehicles, in-band full-duplex relay, self-organizing networks, device discovery in device-to-device communications, jamming mitigation, and imaging.

A major technical challenge in implementing STAR systems is self-interference. Self-interference results in signals that are being transmitted also being directly coupled to the radio frequency (RF) receiving chain of the device. The coupling of the transmitted signals into the receiving portions of the device can make the RF front-end of the device insensitive to incoming signals from other radio transmitters and/or damage the RF front-end.

A possible solution may be to utilize a high-isolation circulator (a circulator having a greater than 45 dB isolation between transmitting and receiving operations over frequencies of interest), but typical compact circulators that are available in the market only offer about 20 dB of isolation between the ports. The low-isolation circulators may be used along with advanced analog and digital cancellation techniques, but this requires an increase of RF components and an increase in silicon area on the chip, which translates to higher power consumption and increased area in the RF front-end and in the radio chips. Some high-end circulators offer 35 dB or higher of isolation, but they often have extremely-narrow isolation bandwidth. In addition, return loss at each port of the circulator is required to be higher than the isolation level provided by the circulator. In other words, if a circulator having a 45 dB isolation level is used, the return loss at each port should be equal to or greater than 45 dB. Achieving these values can be extremely challenging in a practical system implementation.

Other solutions have been proposed in the literature, but these also suffer from low duplex isolation levels, narrow duplex-isolation bandwidths, a lack of channel reciprocity support, a large physical size, high insertion loss, and/or lack of high power handling capability.

The proposed solutions include among others (a) use of a conventional circulator, (b) use of two orthogonal antennas, (c) use of an antenna cancellation technique, (d) use of a directional coupler with a reflective load, (e) use of a loop circulator connecting three circulators, and (f) use of a magnet-less circulator. Each has its shortcomings.

DETAILED DESCRIPTION

Figure 1:
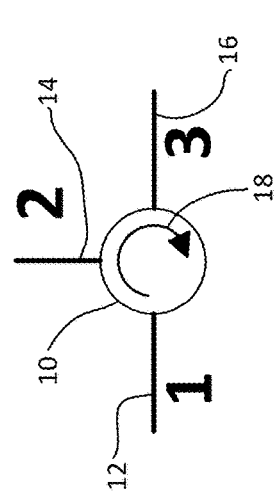
FIG. 1 is a schematic diagram of a circulator component such as may be used in a transmit and receive circuit.

In FIG. 1 is shown a symbol of a circulator element 10 having three ports 12, 14 and 16. The circulator 10 is a three port ferromagnetic device having a magnetic field that operates to carry electrical signals in the frequency band of interest to the next adjacent port in the direction of the arrow 18, but not in the opposite direction. Circulators are used in various radio frequency systems such as for connecting a transmitter and receiver to a shared antenna. Factors which impact performance of the circulator 10 for such applications include isolation, insertion loss, and return loss.

The present apparatus and method provides a broadband high-isolation (HI) circulator for STAR (simultaneous transmit and receive) systems. In certain examples, the broadband high-isolation (HI) circulator for Simultaneous Transmit And Receive (STAR) systems not only breaks the Lorentz reciprocity, but also breaks the symmetry of isolations between circulator ports. Previous COTS (commercial off the shelf) and state-of-the-art circulators have been designed to have a symmetric isolation level between ports for general purpose applications such that any port of the previous circulators can be used as a transmitter (Tx) port, as a receiver (Rx) port, or as an antenna port by rotating the structure. Requiring symmetric isolation adds unnecessary design constrains and limits opportunities to enhance duplex isolation performance.

The present HI (high isolation) circulator of certain aspects uses only passive non-time-varying components, mimics a multi-circulator approach through a phase perturbation with a single circulator, offers relatively low insertion loss, ensures channel reciprocity using an arbitrary single antenna, and allows engineers to use a practical range of return-loss level at each port. Its features can be applied to any circulator (including magnet-less circulators which can be integrated with SIP (system in package)) and enhance the bandwidth and level of the isolation between the transmitter (Tx) port and the receiver (Rx) to meet the required challenging specifications of STAR systems. As shown by the comparison of conventional systems with the present method and apparatus as presented in the graph of FIG. 18, duplex isolation performance of an example of the present HI circulator with a single perturbation loop clearly outperforms that of conventional solutions.

Certain examples of the HI circulator may provide more than 25 dB of duplex-isolation improvement compared to the performance of conventional circulator solutions, while also delivering increased duplex bandwidth with significant relaxation of return-loss requirement. Compared to convention systems, a size reduction benefit is also provided, compared to conventional systems that use two orthogonal antennas, that use antenna-cancellation, and that use multiple circulators.

Examples of the present broadband HI circulator may provide benefits that enable it to be used not only in STAR cellular base stations and Wi-Fi access points, but also in STAR mobile devices by offering doubled spectral efficiency or doubled throughputs. Thus, providers may reduce CAPEX (capital expenditure) and OPEX (operating expenditure) or increase the quality of services for users. STAR systems can be applied to many emerging technologies. Potential applications include 5G-and-beyond wireless communications, radar in autonomous vehicles, in-band full-duplex relay, self-organizing networks, device discovery in device-to-device communications, jamming mitigation, and imaging.

Figure 2:
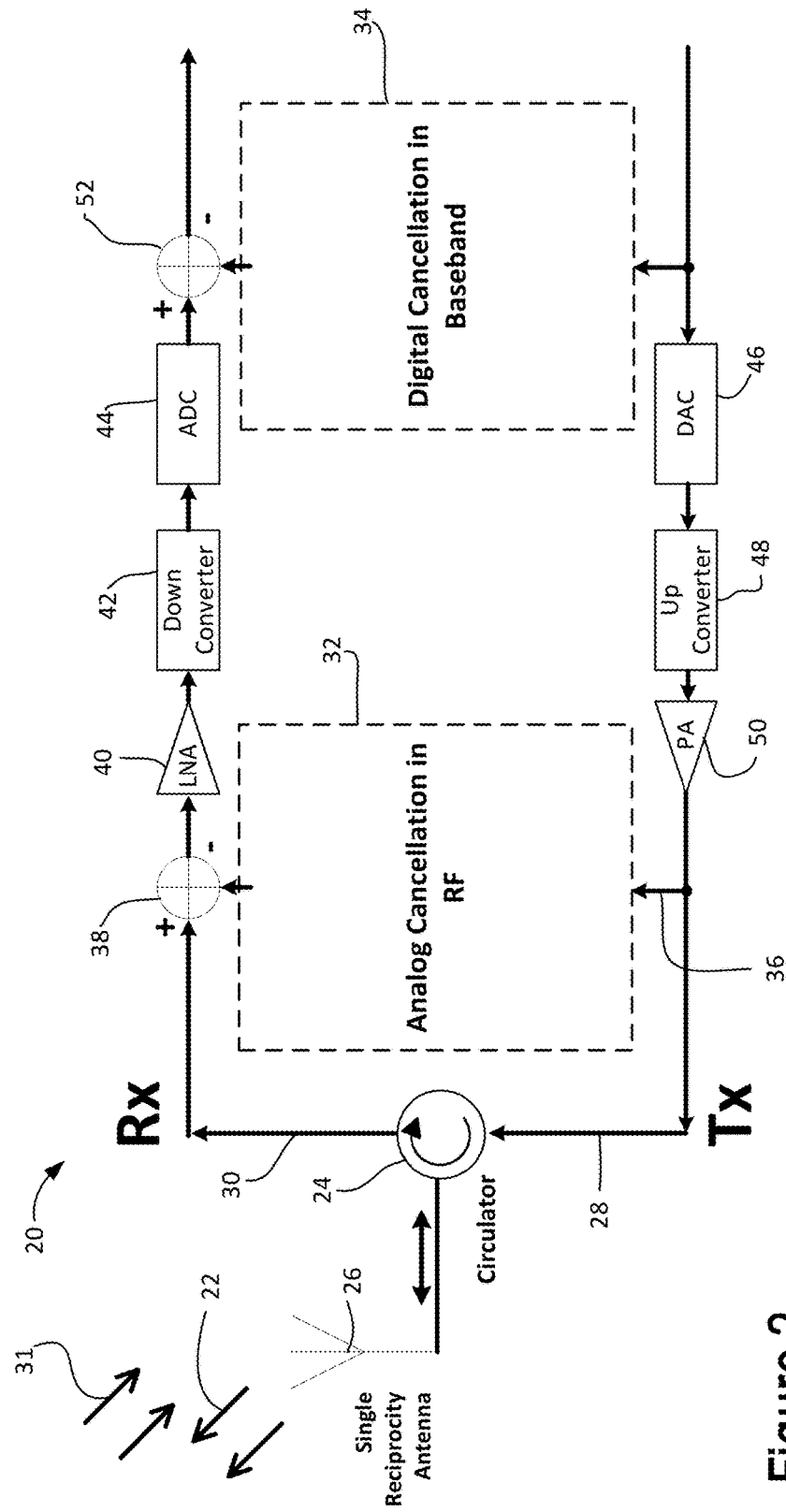
FIG. 2 is a schematic diagram of transmit and receive circuit using a circulator for simultaneous transmit and receive (STAR) operation.

An example of a STAR wireless system 20 using a direct-conversion radio is shown in FIG. 2. RF signals 22 are transmitted to the air through a circulator 24 and a single reciprocity antenna 26. Because of the limited isolation level between transmit (Tx) port 28—labeled Tx in the drawing—and the receive (Rx) port 30—labeled Rx in the drawing—of the circulator 24, there is a direct leakage (self-interference) from the transmitter 28 to its own receiver 30. The self-interference from transmitter 28 interferes with the receiver 30 detecting received radio frequency (RF) signals 31.

In order to suppress the self-interference further, RF cancellation 32 and digital cancellations 34 are considered. Taking the tapped transmitting RF signals at 36 as a basis function, RF interference cancellation signals are generated in the analog cancellation portion 32 through an interpolation process and the resulting phase-reversed interference cancellation signals are injected at the adder 38 to the Rx chain before the received signal reaches a LNA (low noise amplifier) 40. The interpolation process in the analog RF cancellation portion 32 is updated through an adaptive feedback algorithm in real time.

A similar interference cancellation is performed after a down converter 42 and ADC (analog to digital converter) 44 in the receiver chain to suppress the self-interference further and put it below the system noise level. The further cancellation is provided by a digital cancellation in baseband portion 34 that process a signal tapped from the transmitter chain prior to a digital to analog converter 46, an up converter 48 and a power amplifier 50. The resulting digital cancellation is injected into the receiver chain by an adder 52.

Three isolation levels can be defined in the circulator: first—isolation from the transmitter (Tx) to the receiver (Rx) ports (duplex isolation), second—isolation from the antenna to the transmitter (Tx) ports, and third—isolation from the receiver (Rx) to the antenna ports. Among the three isolation levels, only the duplex isolation from the transmitter to the receiver requires a high isolation level for STAR systems, although COTS and the state-of-the-art circulators have been designed to have a similar level for all these isolations. This is a simple observation, but it has been overlooked by engineers and researchers.

Isolation Level Between Tx and Rx Chains in RF (Duplex Isolation)

Figure 3:
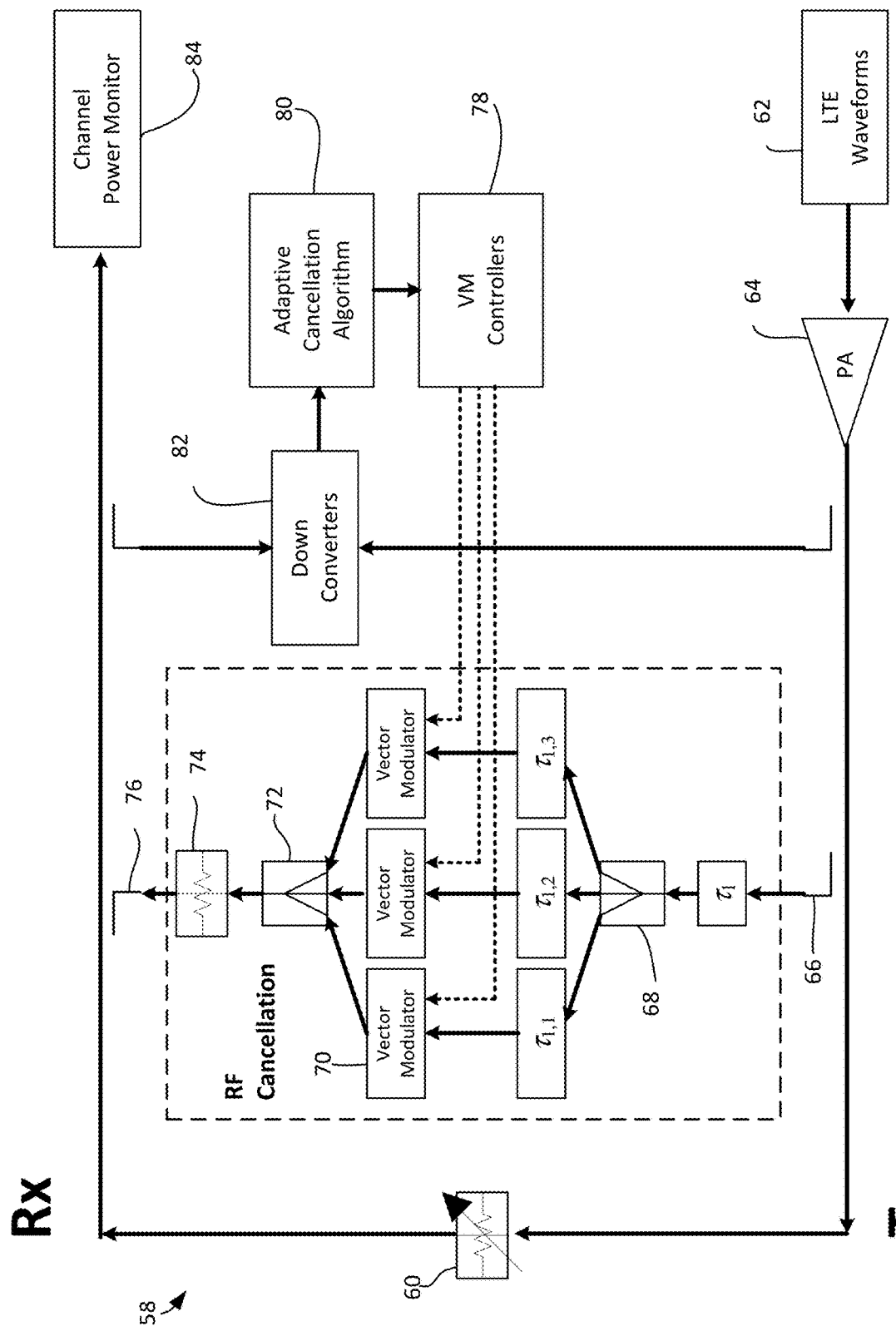
FIG. 3 is a schematic diagram of a measurement setup for measuring analog RF cancellation performance in a STAR wireless system, varying duplex isolation levels in a circulator.

In order to understand the duplex isolation level in a circulator for STAR systems, a study using conducted measurement tests has been carried out using a test system 58. As shown in FIG. 3, the duplex isolation level is simulated and adjusted by using a variable attenuator 60. LTE waveforms 62 having 20-MHz channel bandwidth were injected to a power amplifier 64. The output channel power of the amplifier 64 was calibrated to be 21 dBm at the input of the variable attenuator 60. The Tx LTE signals $\tau_1$ are taped at 66, divided into three tap signals $\tau_{1,1}$, $\tau_{1,2}$ and $\tau_{1,3}$ by a splitter 68 with different delays and amplitudes using delay lines and vector modulators (VMs) 70, combined together at 72 to generate interpolated cancelling signals, and combined at 76 with the interference signals at the Rx chain. An amplitude adjustment 74 may be provided. The complex weights of the vector modulators 70 were updated in real time using vector modulation controllers 78 through an adaptive cancellation algorithm 80 which was implemented in a FPGA (field programmable gate array). Down converters 82 prepared the signals for the adaptive cancellation algorithm 80. The residual channel power was monitored using a spectrum analyzer 84.

The channel power levels were measured by varying the attenuator values after disabling the adaptive RF cancellation algorithms 80, which becomes a baseline without cancellation. Then, the experiment was repeated after turning on the cancellation algorithm 80. The difference between the baseline level and the residual channel power level after the RF cancellation is the active cancellation performance. Because the self-interference signals are suppressed by both the duplex isolation and active cancellation, the sum of the duplex isolation level and the active cancellation level can be referred as total cancellation level.

Figure 4:
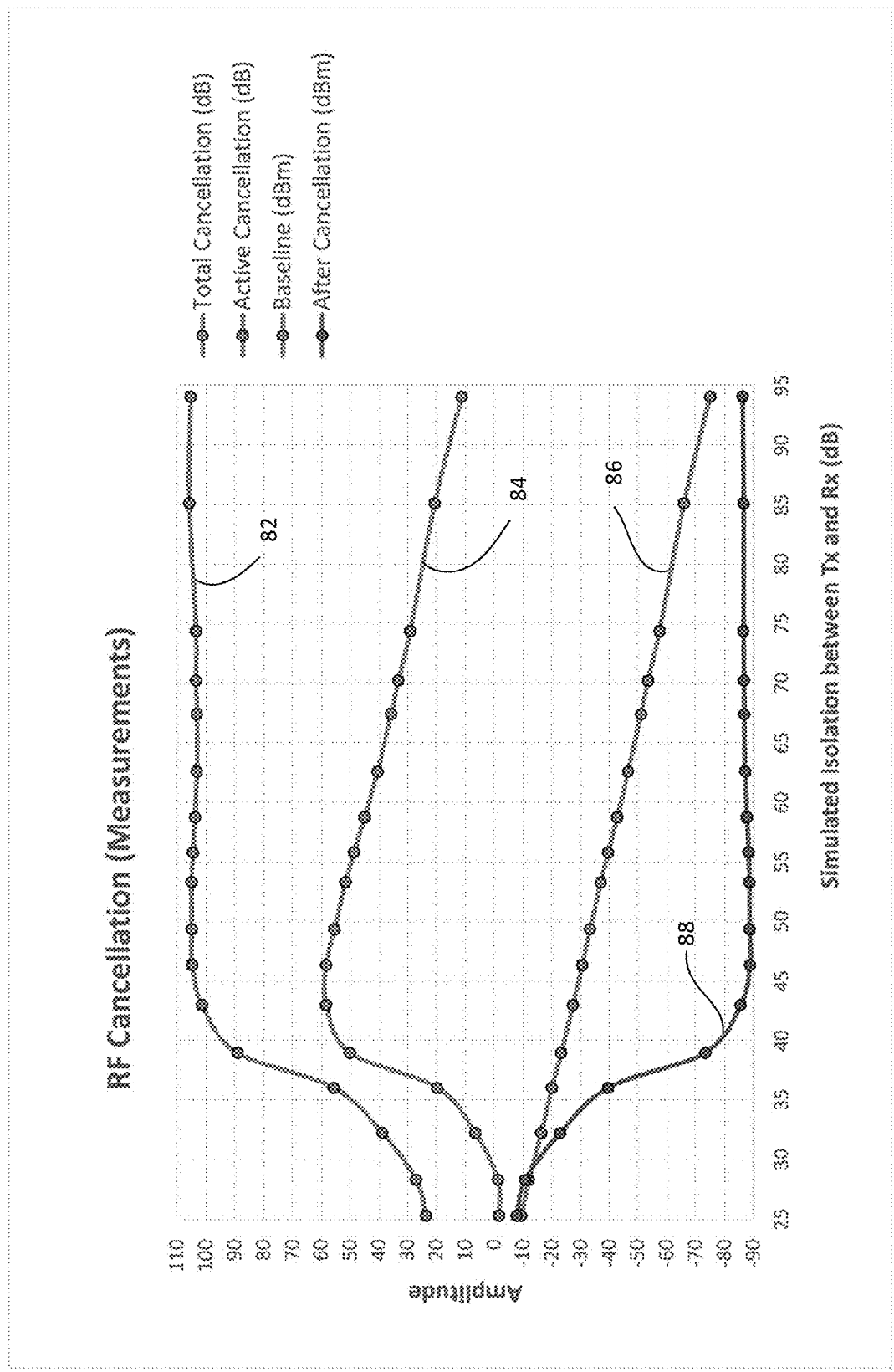
FIG. 4 is a graph showing RF cancellation performance between the transmit and receive chains.

A summary of the experimental study results is plotted in FIG. 4, in which is shown a plot 82 for total cancellation, a plot 84 for active cancellation, a plot 86 for the baseline, and a plot 88 showing after cancellation. It was observed that the active cancellation 84 is hardly effective below 30 dB duplex isolation. The active cancellation 84 level increases as duplex isolation level increases up to 45 dB. If the duplex isolation level increases further, the active cancellation 84 level decreases. However, the total cancellation level 82 becomes relatively constant if the duplex isolation is greater than 45 dB.

Thus, at least 45 dB duplex isolation may be preferred for certain STAR 20 MHz system implementations using three cancellation taps in RF (radio frequency). The residual self-interference signals can be further suppressed at the baseband with a digital cancellation process, which may need 40 dB or higher cancellation performance to put the final residual self-interference signal power below the theoretical thermal noise power level with a several dB margin. If more high-power applications, such as a cellular base station, are considered, 50 dB or higher duplex isolation level may be preferred in practice. More cancellation taps can be considered to decrease the required level of duplex isolation in a circulator, but the cancellation hardware complexity and power consumption quickly increase as the number of taps increases.

Structure of Broadband High-Isolation Circulators

Figure 5:
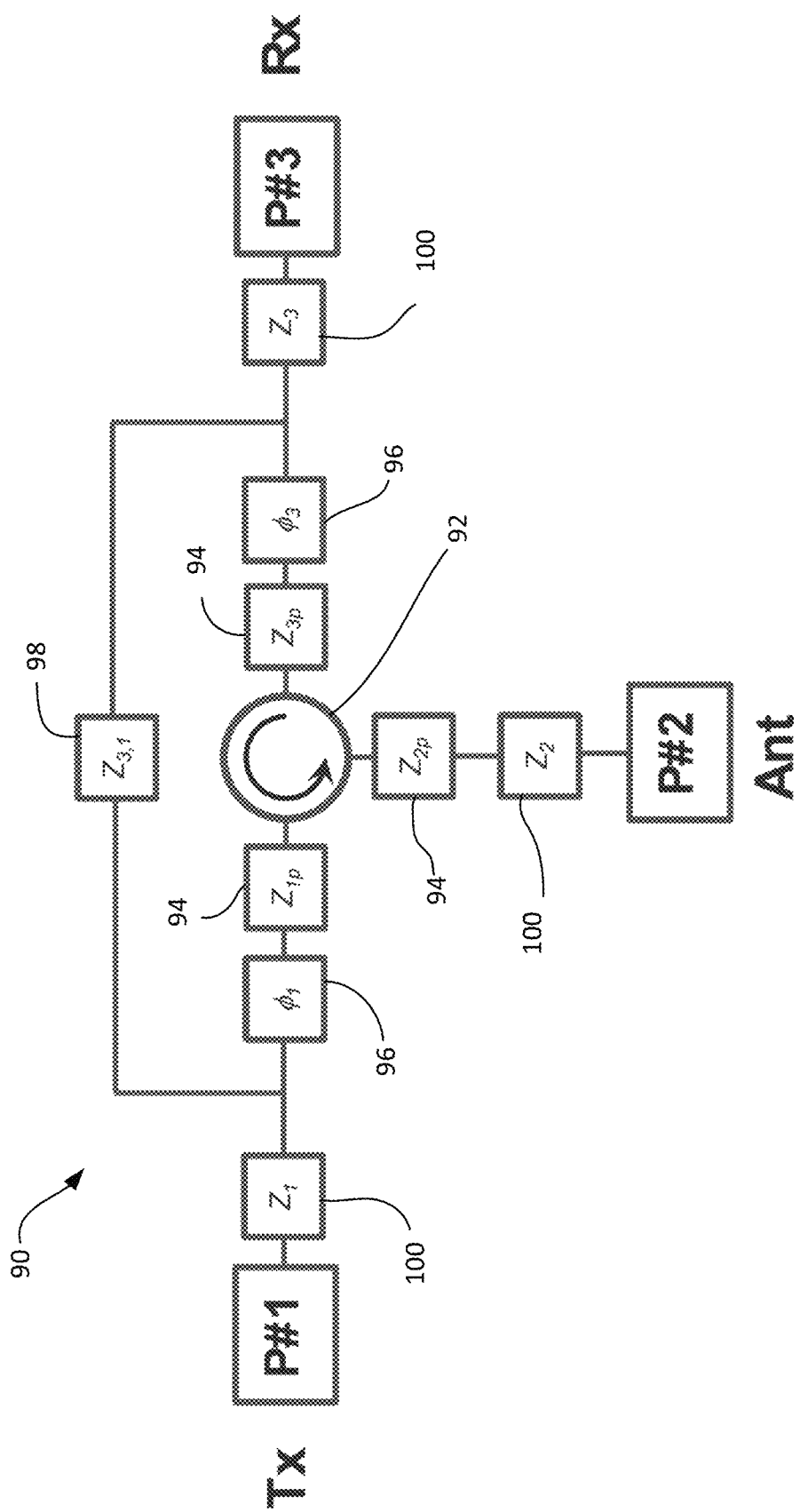
FIG. 5 is a functional block diagram of a broadband high-isolation circulator with a single perturbation loop.

A block diagram of an example of a broadband high-isolation circulator 90 is shown in FIG. 5. The circulator 90 has a first port P#1 to which is connected a transmitter Tx, a second port P#2 to which is connected an antenna Ant, and a third port P#3 to which is connected a receiver Rx. The base circulator 92 in the center of the block diagram is assumed to be have a nominal duplex isolation performance and it is mainly used for breaking the Lorentz reciprocity. Thus, any previous COTS (commercial off-the-shelf) or state-of-the-art circulator component can be used as the circulator 92. The ports of the nominal-performance circulator 92 are connected with pre-conditioning impedance blocks 94, labeled $Z_{ip}$, where i=1, 2, and 3. Depending on the characteristics of the circulator 92, the pre-conditioning impedance blocks 94 can be fully or partially omitted. Phase-shifting blocks 96, labeled $\phi_1$ and $\phi_3$, are connected to the impedance blocks 94, labeled $Z_{1p}$ and $Z_{3p}$ respectively. Another impedance block 98, labeled $Z_{3,1}$, is connected to both of the phase blocks 96, $\phi_1$ and $\phi_3$ to create a loop between the transmitter (Tx) and receiver (Rx) ports of the circulator component 92.

The phase difference between the phase-shifting blocks 96, $\phi_1$ and $\phi_3$ acts as a perturbation, interacts with the impedance block 98, $Z_{3,1}$, and enables a broadband high isolation performance between the transmitter (Tx) and receiver (Rx) ports by creating double continuous peaks. The pre-conditioning impedance blocks 94 together with the loop block 98 break the condition that the return loss level should be equal to or greater than the isolation level. Finally, impedance matching blocks 100, labeled $Z_i$, where i=1, 2, and 3, are connected. It can be shown that the impedance matching blocks 100, $Z_1$ and $Z_3$, are necessary for 50Ω reference-impedance systems, after the high duplex performance is achieved. Thus, the impedance block 100, $Z_2$, can be omitted if an antenna itself is reasonably matched.

All impedance blocks 94, 98 and 100 may consist of simple passive non-time-varying components, such as classic resistors, inductors, and capacitors. The phase-shifting blocks 96 can be implemented with HTCC/LTCC (high temperature co-fired ceramic/low temperature co-fired ceramic), SAW (surface acoustic wave), BAW (bulk acoustic wave), or FBAR (film bulk acoustic resonator) technology to minimize the insertion loss.

Simulation Results

Figure 6:
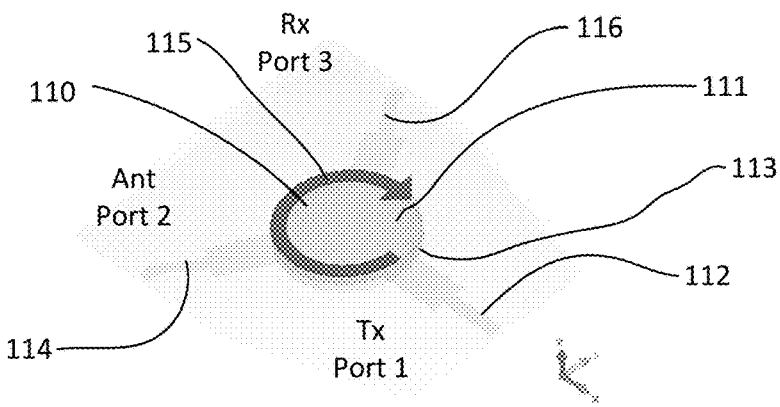
FIG. 6 is a perspective view of a strip-line circulator with magnets.

In order to demonstrate the benefits of the present broadband high-isolation circulator 90, FIG. 6 shows a conventional strip-line circulator 110 with magnets 111 and 113 that has been designed for LTE (long term evolution) B38 (band 38=TDD 2600) applications with 20 MHz channel bandwidth (2.594-2.614 GHz, fc=2.604 GHz) through full-wave EM simulations. The magnets 111 and 113 are disc magnets that are mounted on the top and bottom of the circulator to cause the signals to move in the direction indicated by arrow 115. The direction of rotation for the circulator 110 is from the transmitter port to the antenna port to the receiver port so that signals are carried from the transmitter to the antenna and from the antenna to the receiver. The strip-line circulator 110 serves as a reference conventional circulator design and also a starting point of the broadband HI circulator. The circulator has a transmitter port 112 (also designated as Port 1), an antenna port 114 (also designated as Port 2), and a receiver port 116 (also designated as Port 3). The port numbering conventions are used throughout this specification. The structure and port definitions are shown in FIG. 6.

Figure 7:
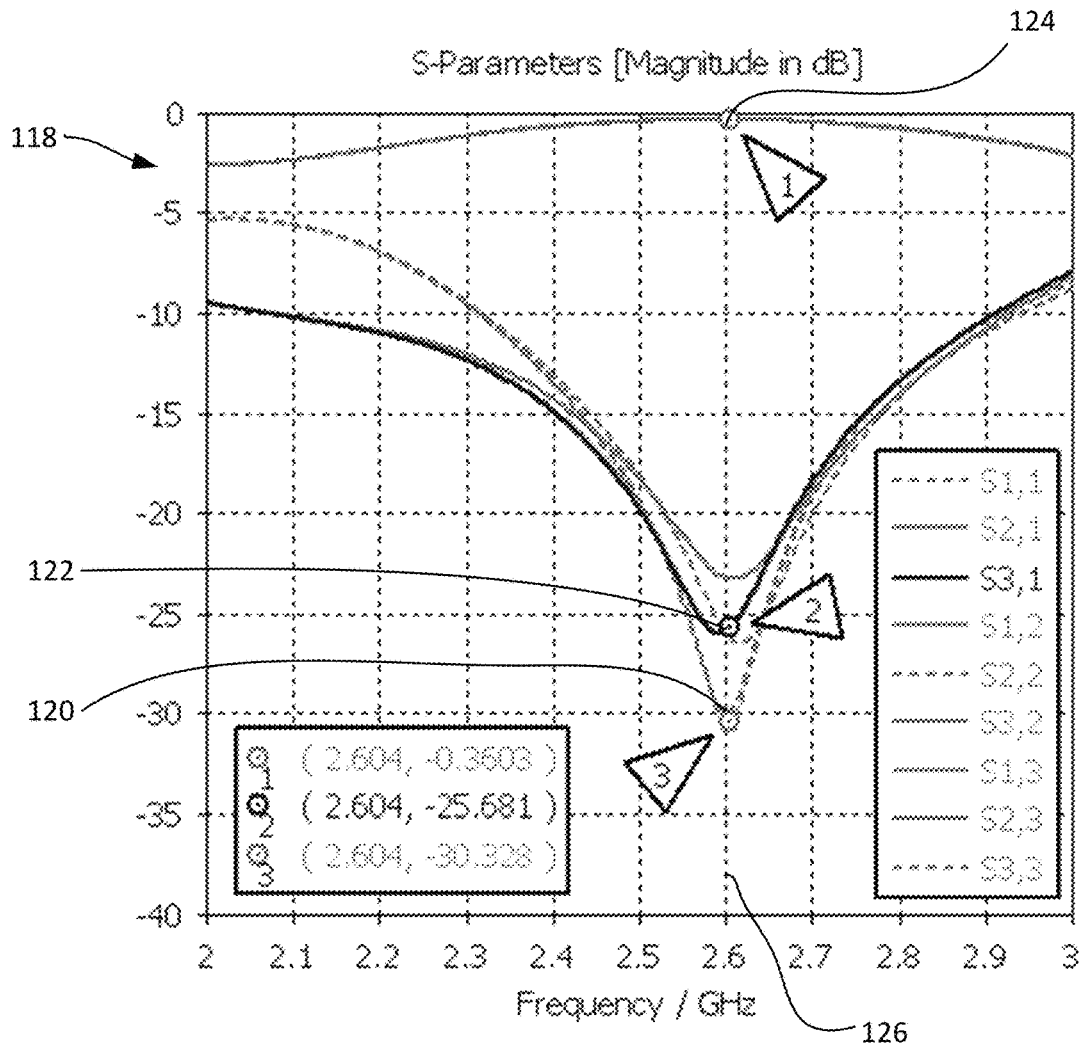
FIG. 7 is a graph of insertion loss over frequency and coupling levels between ports of the circulator of FIG. 6.

A graph 118 of isolation, insertion loss, and return loss performance of the circulator 110 is shown in FIG. 7. Notice that the return loss at 120 is about 30 dB which is higher than the 26 dB isolation level at 122. The insertion loss is shown at 124. Each labeled point is at the LTE band 38 center frequency (fc) of 2.604 GHz as shown on the graph at 126.

Figure 8:
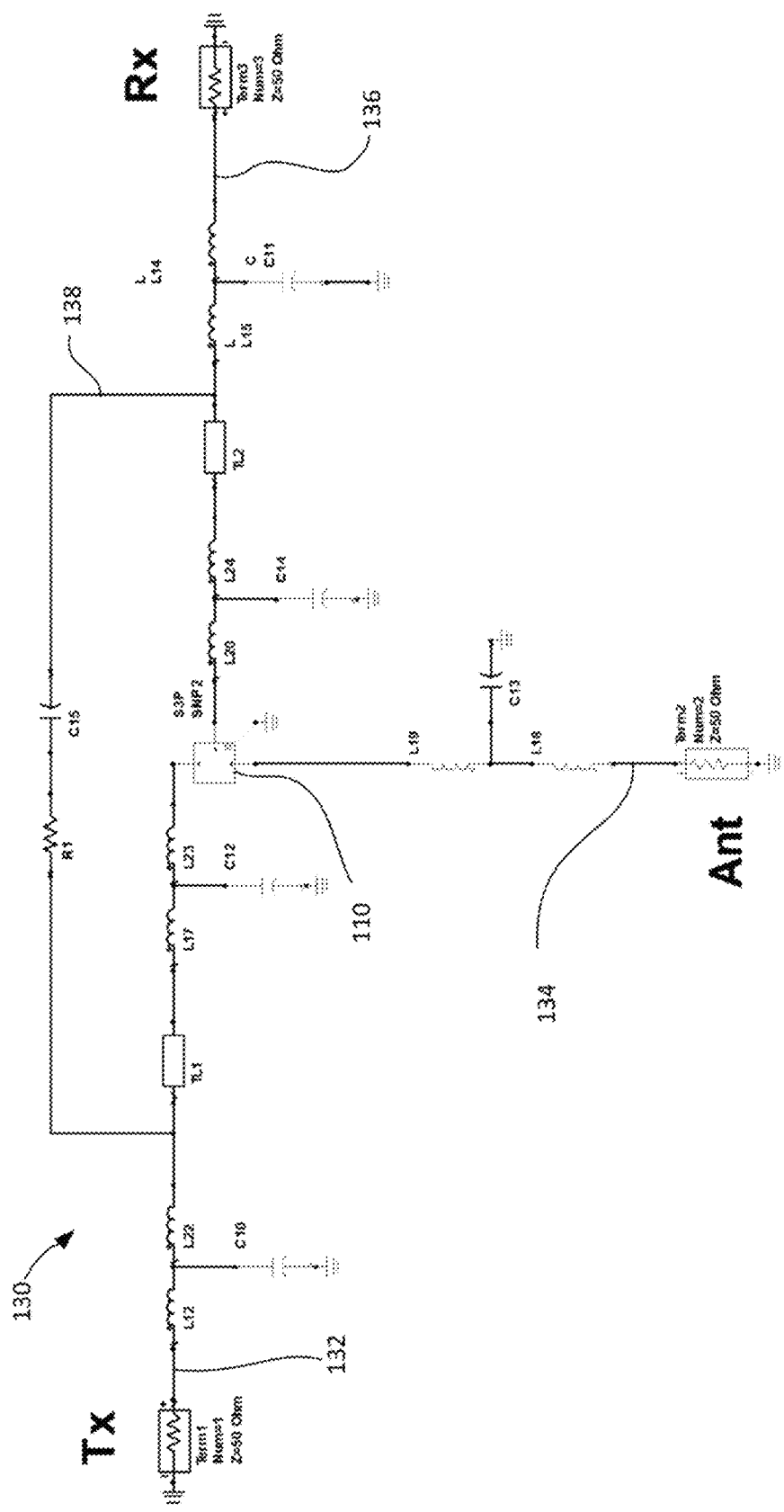
FIG. 8 is a circuit diagram of a broadband high-isolation circulator.

An example of a broadband high-isolation (HI) circulator 130 has been provided, using the conventional strip-line circulator 110. A schematic diagram of the HI circulator 130 is shown in FIG. 8. In the circuit diagram, in a transmitter branch 132, from the transmitter terminal 1 (Term 1) which has a 50Ω system reference impendence, a pair of inductors L12 and L22 and a capacitor C10 connect to a transmission line TL1 to provide phase shifting and a pair of inductors L17 and L23 and a capacitor C12 which connect to the transmitter port of the circulator 110. In the antenna branch 134, from the antenna port of the circulator 11 toward the antenna port Ant (Term 2) is a pair of inductors L19 and L18 and a capacitor C13. The antenna terminal has a 50Ω system reference impedance. In the receiver branch 136, the receiver port of the circulator 110 is connected to an inductor pair L20 and L24 and a capacitor C14, a transmission line TL2, and an inductor pair L15 and L14 and a capacitor C11. The receiver terminal (Term 3) has a 50Ω system reference impedance. In the loop 138 is a resistor R1 and a capacitor C15. Characteristics of the conventional strip-line circulator is included as a 3-port scattering parameter.

Figure 9:
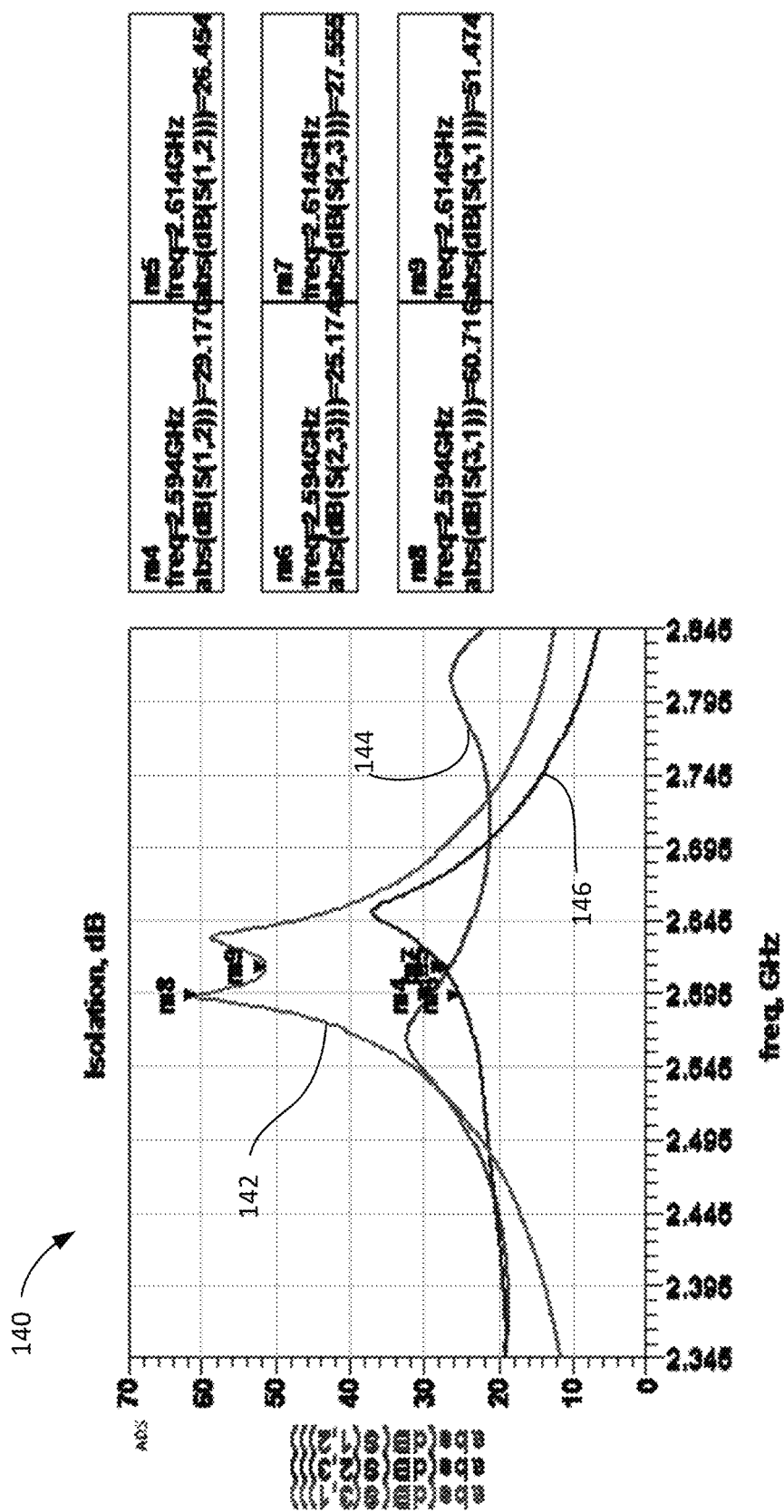
FIG. 9 is a graph of simulated isolation performance of a high-isolation circulator of FIG. 8.
Figure 10:
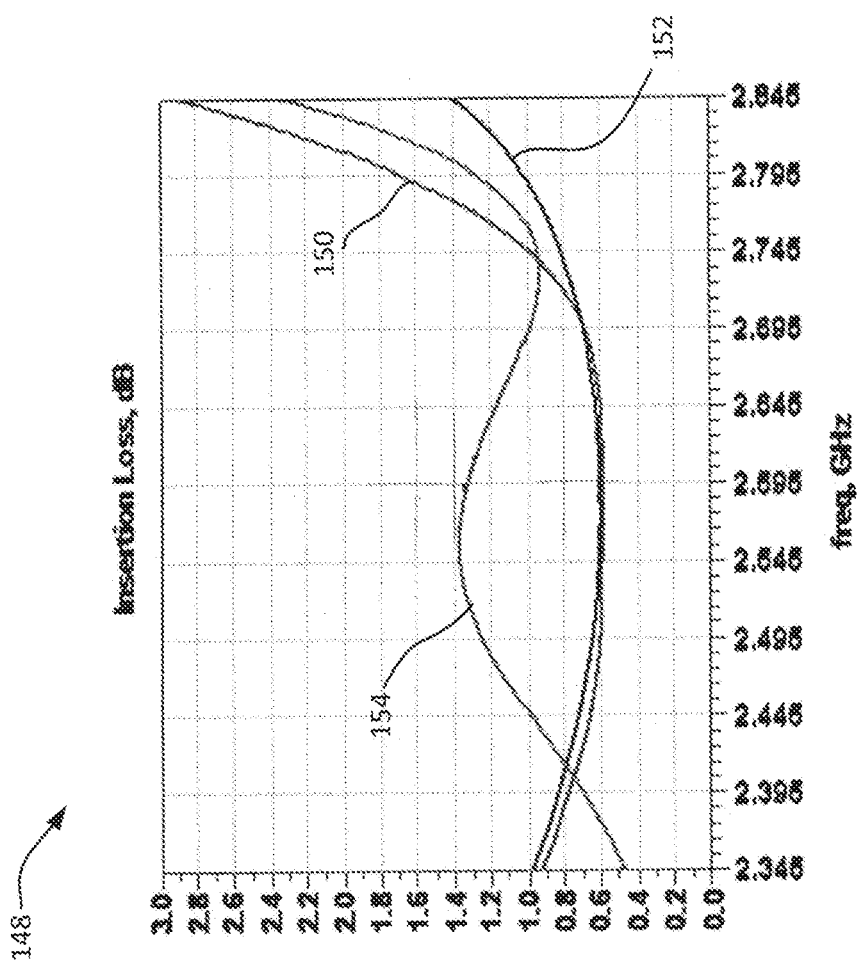
FIG. 10 is a graph of simulated insertion loss of a high-isolation circulator of FIG. 8.
Figure 11:
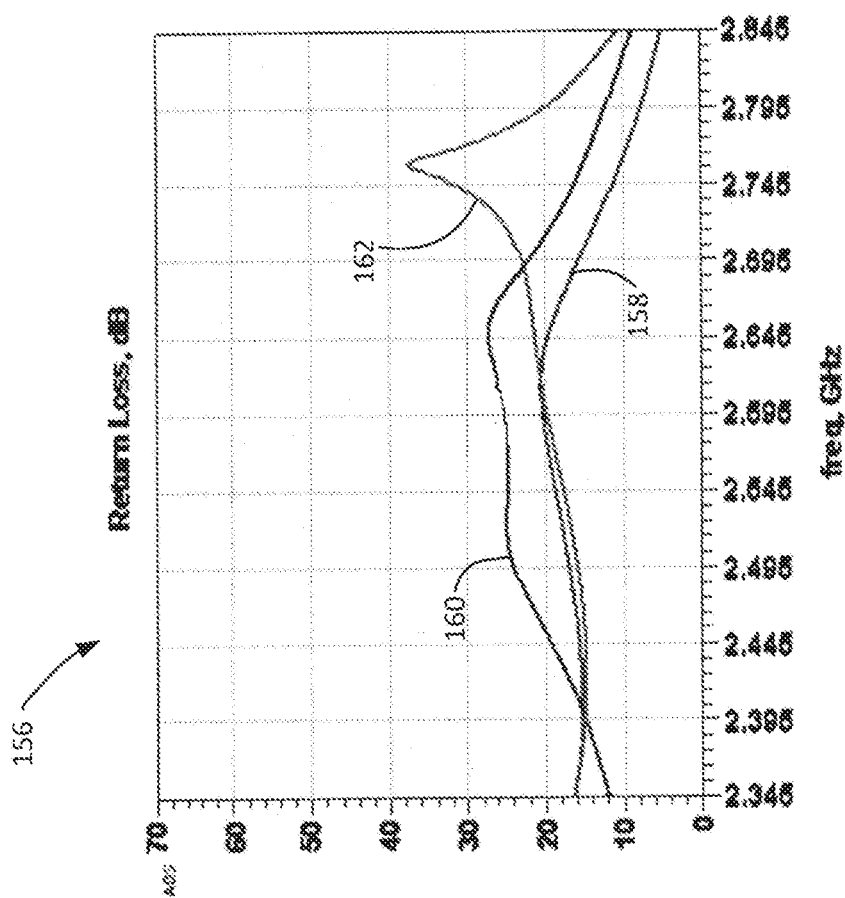
FIG. 11 is a graph of simulated return loss of a high-isolation circulator of FIG. 8.

Isolation, insertion loss, and return loss performance plots of the example broadband HI circulator are shown in from FIG. 9 through FIG. 11. As shown in the graph 140 of FIG. 9, the duplex isolation (the isolation between transmitter Tx and receiver Rx ports) is plotted on line 142 where it reaches at least 51 dB in the operational band, which is a 25 dB improvement when it is compared to that of the conventional strip-line circulator design. Other isolation levels as shown at 144 and 146 are similar to those of the compared conventional circulator design. Notice that there are two peaks in the plot 142 which basically create a broad duplex isolation bandwidth.

Figure 18:
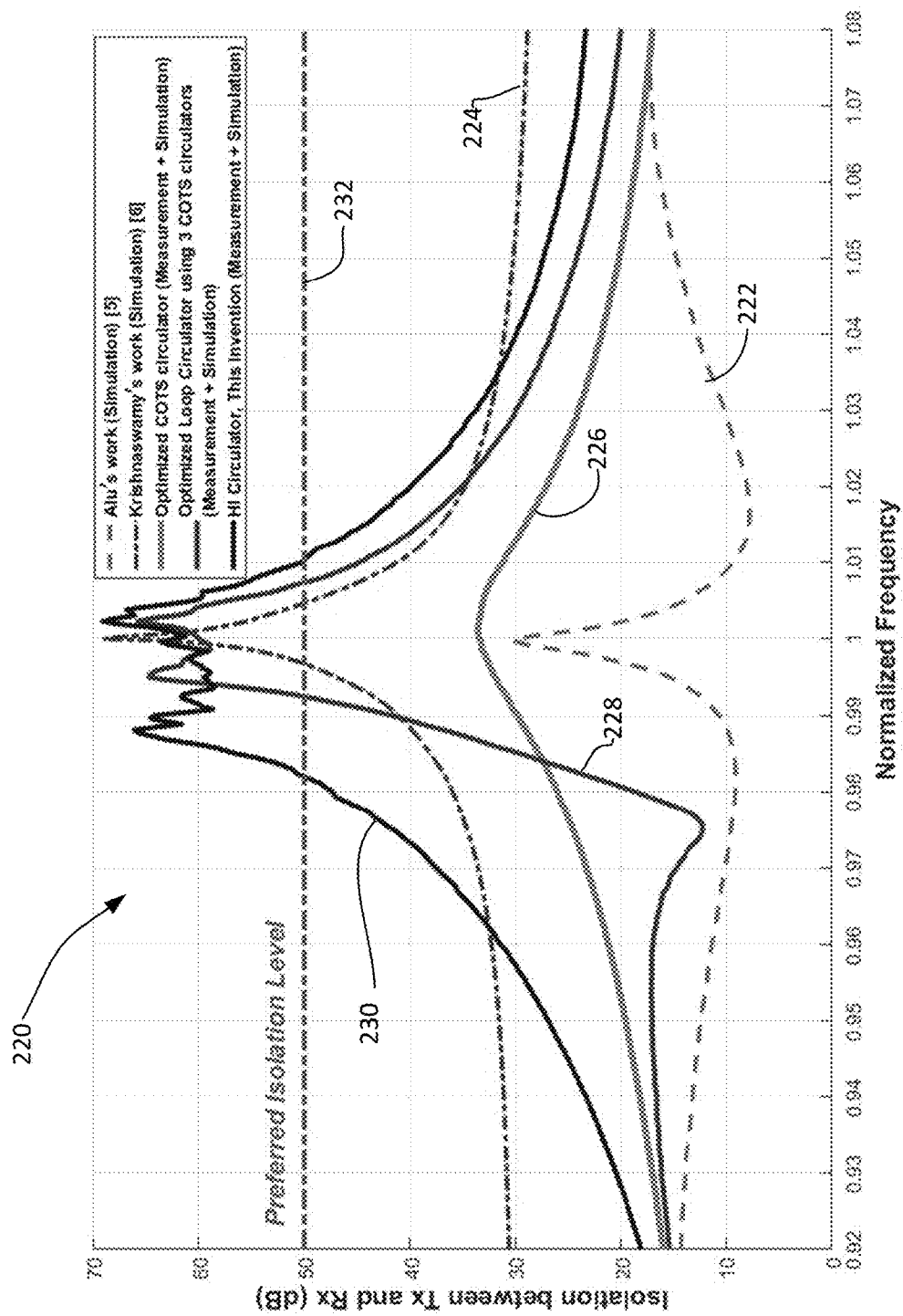
FIG. 18 is a graph of isolation between a transmit port and a receive port of conventional isolation systems and by comparison the present high isolation circulator system.

As is known from conventional loop-circulator solutions using three circulators as shown in FIG. 18, multiple circulators are needed to create multiple peaks and broaden the duplex isolation. This is similar to an equal-ripple filter design concept. In the case of the present HI circulator, only a single circulator is used with a phase perturbation approach and the resulting duplex bandwidth is larger than that of the multi-circulator design. Because only a single circulator is used, reduced hardware complexity and lower insertion loss can be obtained for the present HI circulator.

In FIG. 10, the insertion losses graph 148 between the transmitter Tx and antenna ports as shown on line 150 as well as the insertion losses between the Antenna and receiver Rx ports as shown on line 152 are slightly increased, but it depends on the loss of the individual passive components that are used to create the broadband HI circulator. Notice that the insertion loss for the direction from receiver Rx to transmitter Tx ports as shown on line 154 has been noticeably elevated. In a sense, this elevated insertion loss is preferred because reflections from LNA (low noise amplifier) input can be suppressed.

The return loss performance curves are shown by graph 156 in FIG. 10 for all the ports are in the range of 20-26 dB, which is a relatively fine impedance matching. However, it is practically achievable. This is 25-30 dB relaxation of the return loss level, comparing to the case of conventional circulator design. The graph shows the return loss for the transmitter port at line 158, for the antenna port at line 160 and for the receiver port at line 162.

Results Using Measured Data of Commercial Off-the-Shelf (COTS) Circulator

Figure 12:
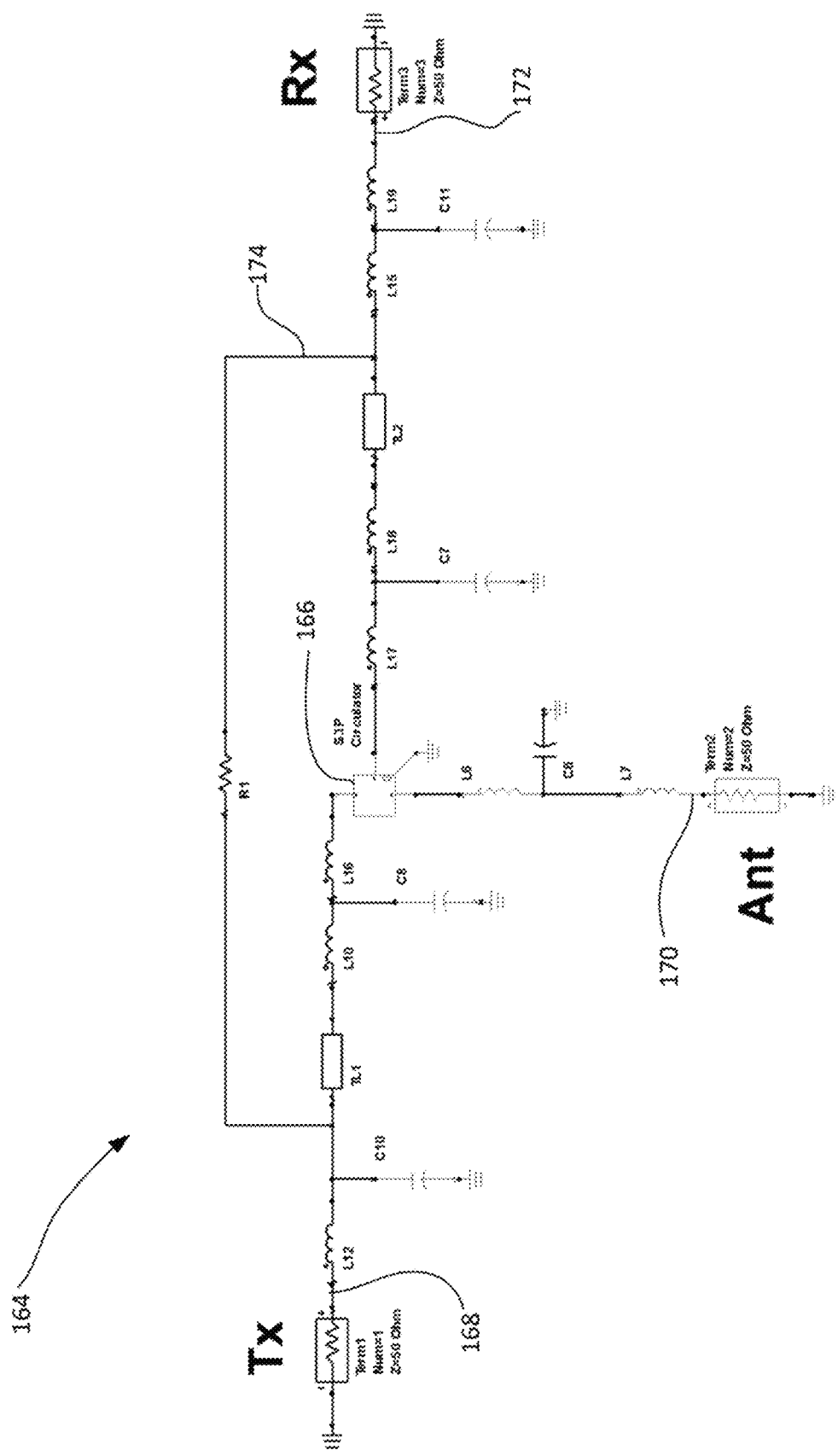
FIG. 12 is a circuit diagram of a broadband high-isolation circulator using a commercially available circulator.

In order to understand the practical implementation feasibility of the broadband high-isolation (HI) circulator, the HI circulator was configured again by using a conventional COTS circulator 166. A schematic diagram of an example of a HI circulator 164 is shown in FIG. 12, which include full 3-port data of measured scattering parameters of the COTS circulator 166. A transmitter branch 168 includes an inductor L12, a capacitor C10, a transmission line TL1, an inductor pair L10 and L16 and a capacitor C8. The antenna branch 170 has an inductor L7, a capacitor C6 and an inductor L6. The receiver branch 172 includes an inductor pair L19 and L15, a capacitor C11, a transmission line TL2, an inductor pair L18 and L17, and a capacitor C7. A perturbation loop 174 includes a resistor R1.

Figure 13:
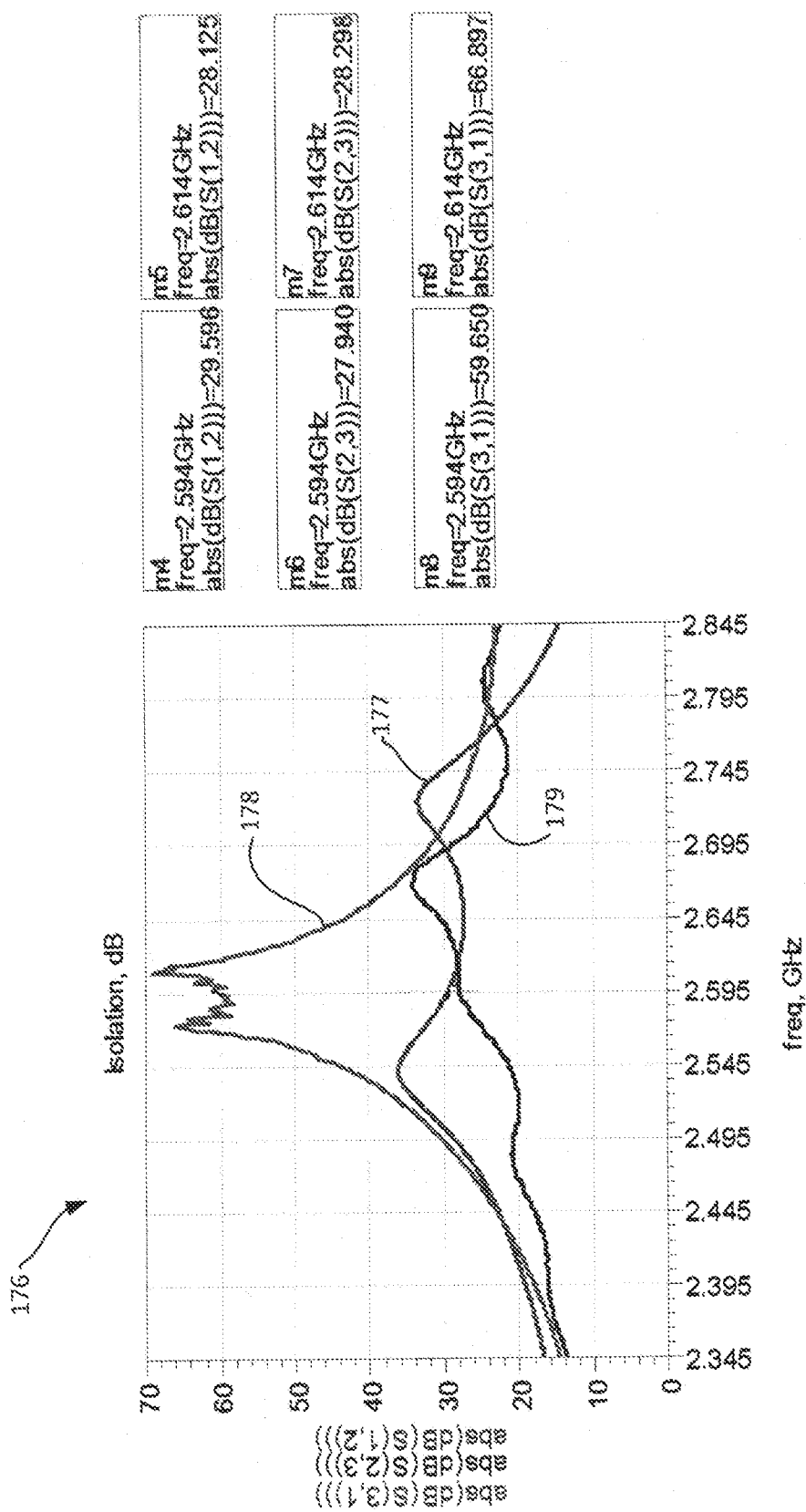
FIG. 13 is a graph of isolation between ports of a high-isolation circulator using a commercially available circulator.

A measured result of an optimized COTS circulator in FIG. 18 shows approximately 32 dB peak of duplex isolation, which is even not close to the preferred specification of duplex isolation level (45 dB or 50 dB, depending on applications). Compared to the conventional circulator, the duplex isolation level of the designed HI circulator of FIG. 12 is shown in a graph 176 in FIG. 13 which shows that an isolation of at least 59 dB (27+dB improvement) as plotted by line 178. Line 178 shows the isolation between the port 1—transmitter and the port 3—receiver. Line 177 shows the isolation between the port 1—transmitter and the port 2—antenna while the line 179 shows the isolation between the port 2—antenna and the port 3—receiver.

Figure 14:
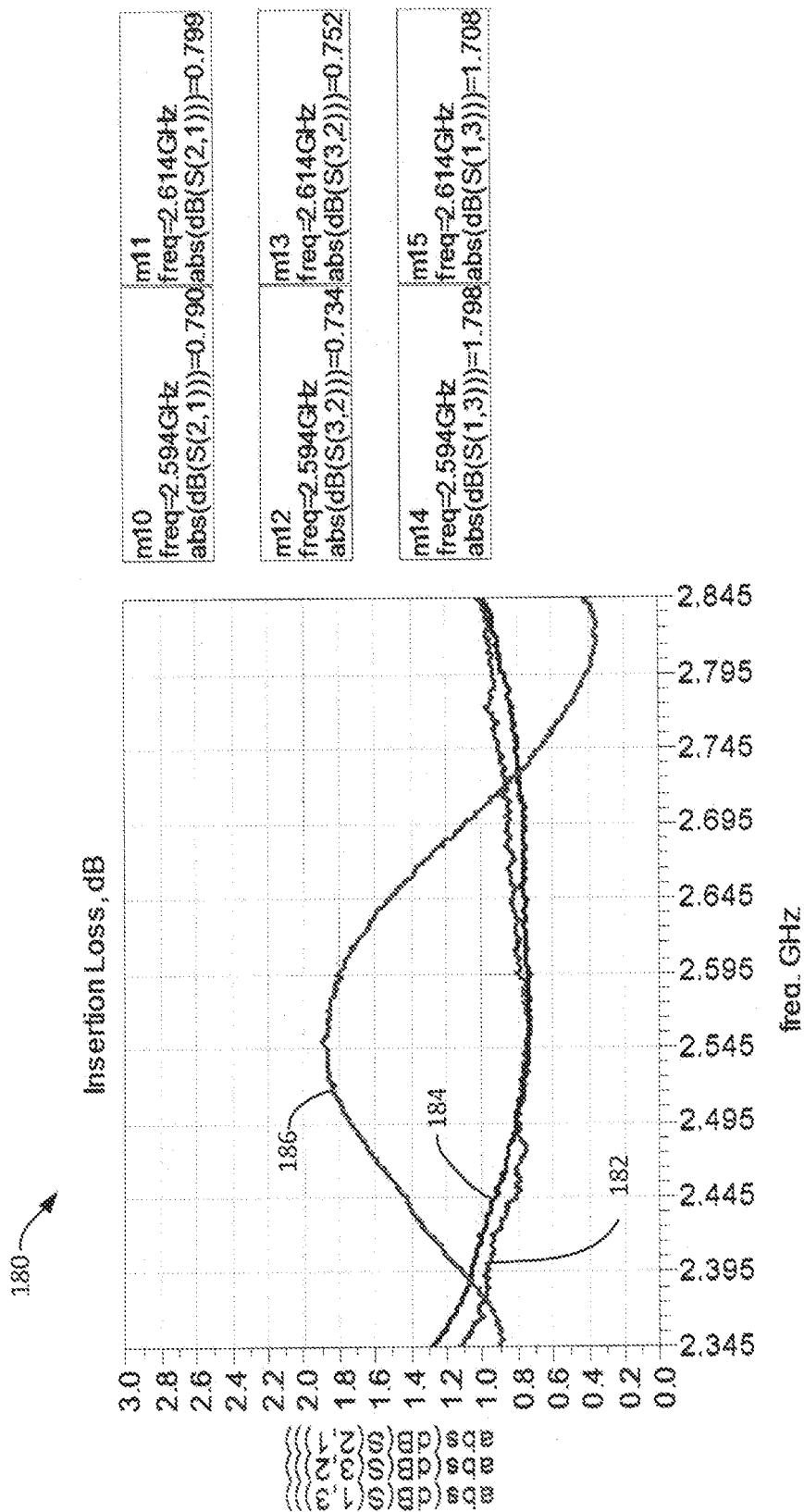
FIG. 14 is a graph of insertion loss of a high-isolation circulator using a commercially available circulator.

The insertion loss for the circuit of FIG. 12 is shown in the graph 180 of FIG. 14. The insertion loss between the transmitter Tx (port 1) and Antenna (port 2) ports are shown at 182 as well as the insertion loss between the Antenna (port 2) and the receiver Rx (port 3) ports as shown at 184 is about 0.8 dB. This is a slight increase, compared to that of the COTS circulator. The insertion loss between the transmitter and receiver is shown at 186.

Figure 15:
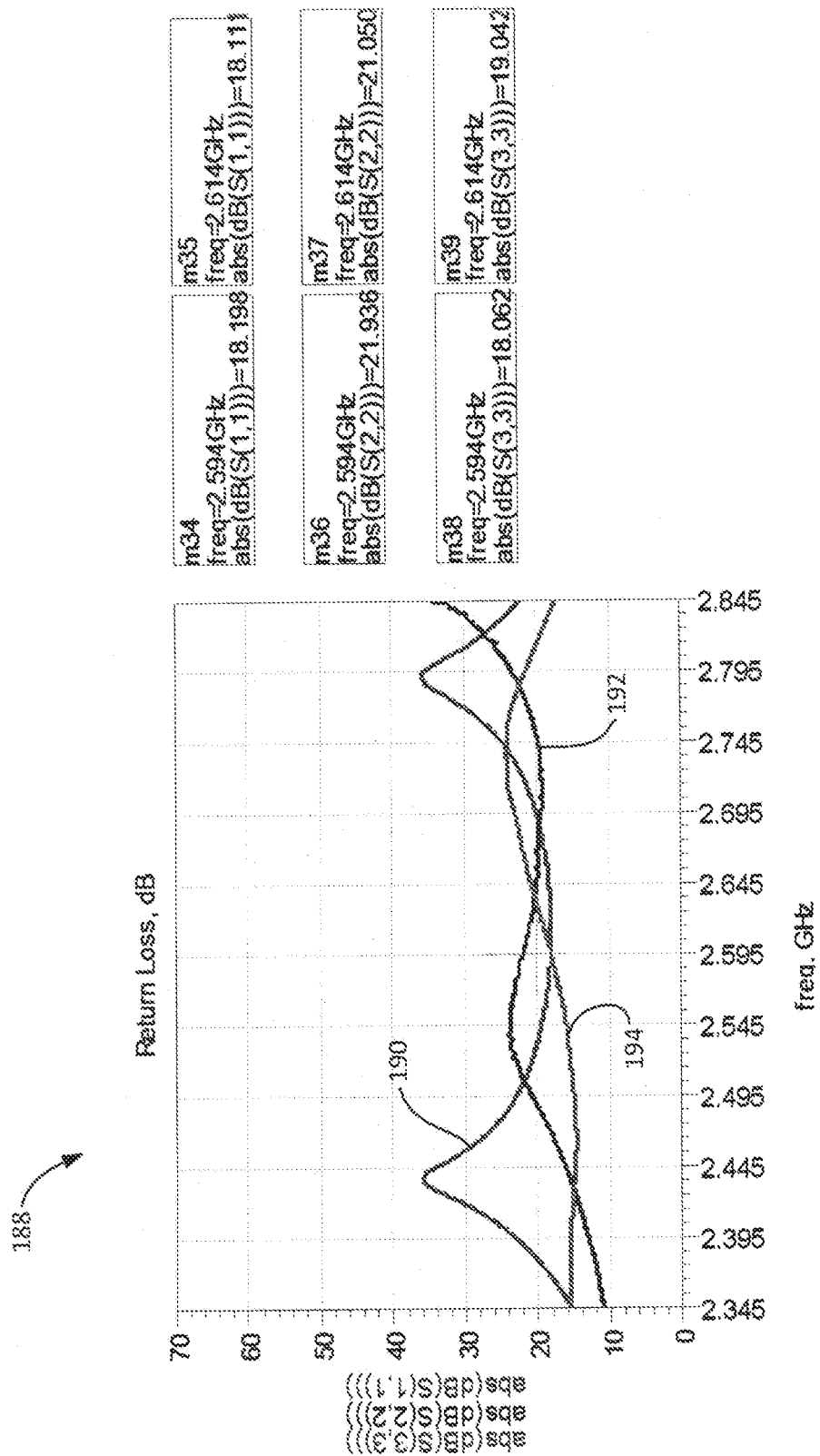
FIG. 15 is a graph of return loss of a high-isolation circulator using a commercially available circulator.

The return loss level of the HI circulator ports is shown in the graph 188 in FIG. 15 is in the practical achievable range of 18-22 dB. Line 190 shows the return loss for the transmitter port, line 192 shows the return loss for the antenna port, and line 194 shows the return loss for the receiver port.

Results of Broadband High-Isolation (HI) Circulator Having Double Perturbation Loops Previous solutions, which have been used for conventional circulators to improve isolation bandwidth and level, can also be applied to the present HI circulator. However, these approaches typically result in the trade-off relationship between isolation level and bandwidth. Compared to these previous approaches, increasing the number of loops in the HI circulator structure can improve both duplex-isolation level and bandwidth.

Figure 16:
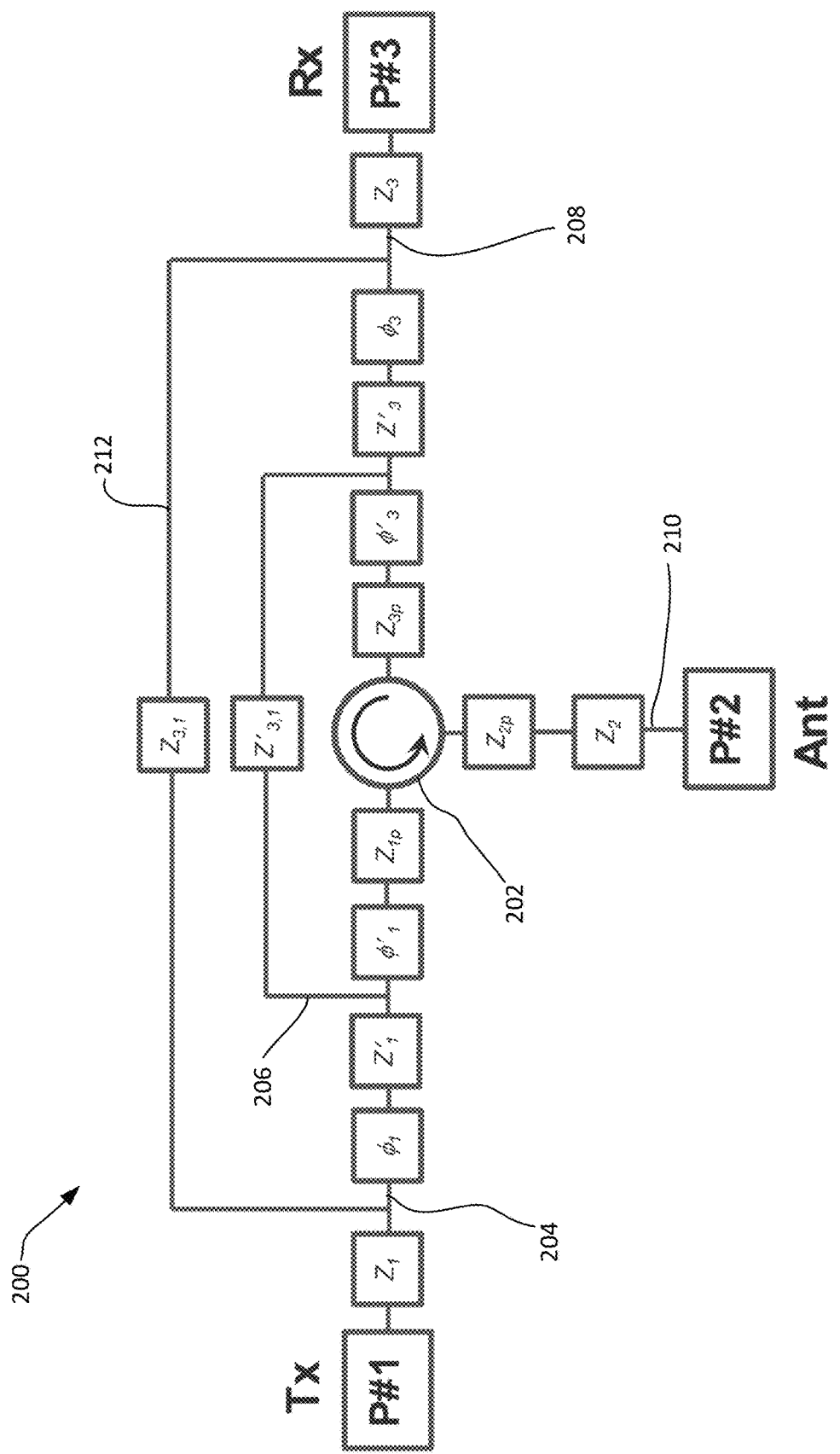
FIG. 16 is a functional block diagram of a double-perturbation-loop high-isolation circulator.

In order to demonstrate the benefits of a multi-loop HI circulator, a double-perturbation-loop HI circulator 200 as an example in FIG. 16. A circulator 202 is provided with a transmission branch 204 having an additional phase shifting block $\phi'_1$ and an additional impedance block $Z'_1$. An additional loop 206 has an impedance $Z'_{3,1}$ and is connected between the phase shifting block $\phi'_1$ and additional impedance block $Z'_1$. The receiver branch 208 has an additional phase shifting block $\phi'_3$ and an additional impedance block $Z'_3$ and the additional loop 206 with its impedance $Z'_{3,1}$ is connected between the phase shifting block $\phi'_3$ and additional impedance block $Z'_3$. The antenna branch 210 and the first loop 212 are unchanged.

Figure 17:
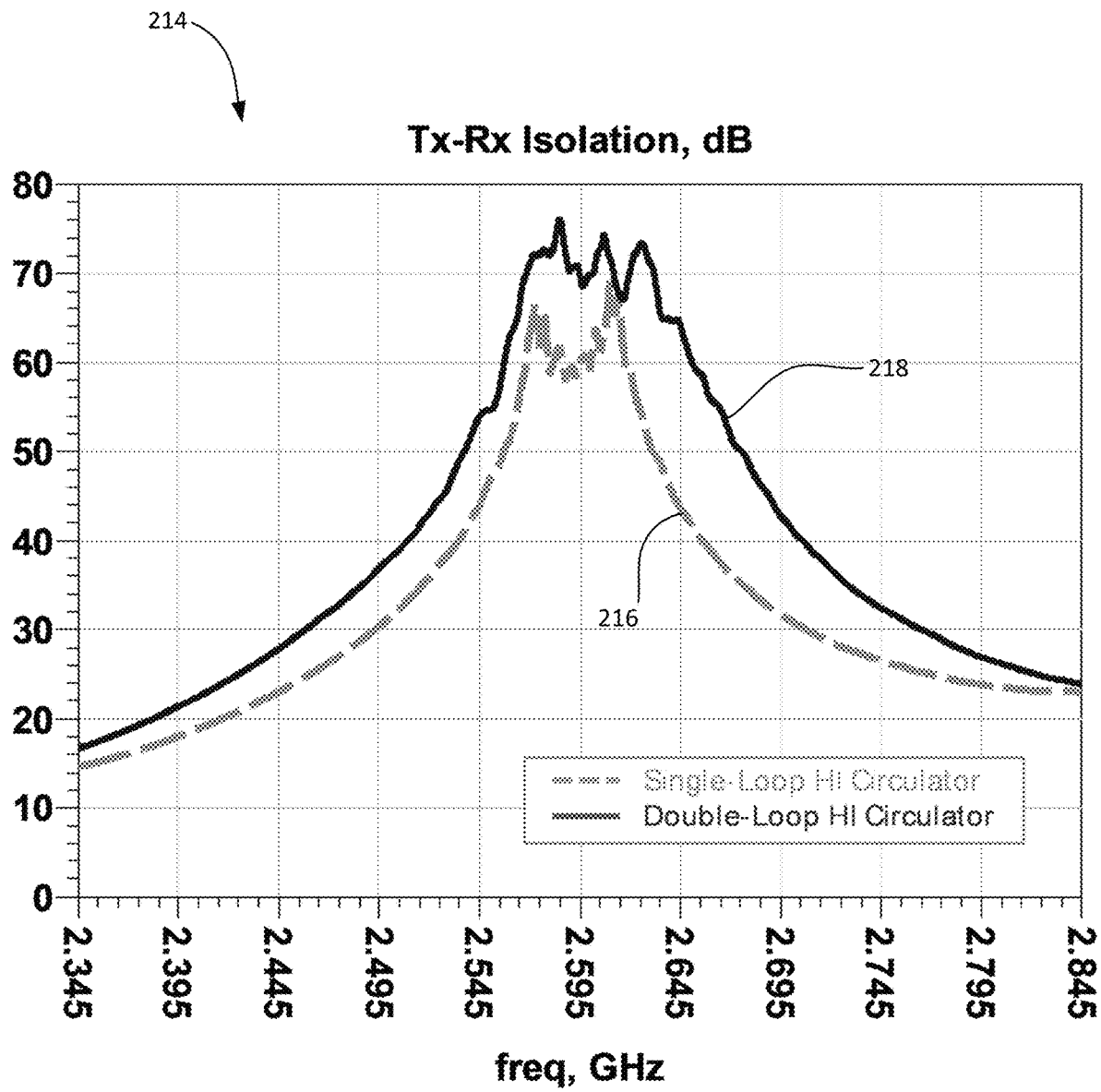
FIG. 17 is a graph of duplex isolation comparing a single perturbation loop circulator to a double perturbation loop circulator.

Turning to FIG. 17, a graph 214 of duplex isolation performance provides a comparison of the transmitter to receiver (Tx to Rx) isolation for the single loop high isolation circulator as shown by line 216 and for a double loop high isolation circulator as shown by line 218. The graph of FIG. 17 clearly shows that both duplex bandwidth and level are improved for the double-perturbation-loop HI circulator. Notice that the double-perturbation-loop HI circulator creates three peaks in the isolation plot 218. If a conventional previous multi-circulator loop approach was used to create three peaks in a brute-force way, nine COTS circulators might be required and the resulting duplex bandwidth would be narrower and insertion loss would be higher.

FIG. 18 is a graph 220 that compares the duplex isolation level produced by several conventional circulators to the isolation provided by the present high isolation circulator. At line 222 is shown a magnet-less circulator by Alu. At line 224 is shown a magnet-less circulator by Krishnaswamy. At line 226 is shown the isolation performance of an optimized commercial-off-the-shelf (COTS) circulator. At line 228 is shown the isolation performance of an optimized loop circulator using three COTS circulators. Lastly, at line 230 is shown the isolation performance of the high-isolation single-loop circulator. The plot 230 is comparable to the isolation performance shown in FIG. 13. A preferred isolation level 232 is shown with a several dB margin. The lines 222 and 226 never make it above the preferred level. The line 224 provides a narrow frequency band above the preferred level. Use of three circulators at 228 widens the band above the preferred frequency. But the present high isolation circulator as shown at 230 provides the widest frequency band above the preferred isolation level 232, and requires only a single circulator.

Thus, there has been shown and described aspects of a high isolation broadband circulator for use in a simultaneous transmit and receive system. Various aspects of the method and apparatus are provided according to the following.

In a first aspect, a circulator system for a simultaneous transmit and receive system, comprising: a transmitter port and an antenna port and a receiver port of the circulator system; a circulator component having a first port and a second port and a third port, the circulator being operable to carry signals from the first port to the second port and being operable to carry signals from the second port to the third port; a first phase shifting element connected in a first signal path between the first port r and the transmitter port, the first phase shifting element being operable to apply a first phase shift to signals carried on the first signal path; a second phase shifting element connected in a second signal path between the third port and the receiver port, the second phase shifting element being operable to apply a second phase shift to signals carried on the second signal path; and a loop including a loop impedance, the loop having a first end connected to the first signal path and a second end connected to the second signal path.

In a second aspect, a circulator system according to a first aspect, wherein the first phase shifting element is connected in a signal path and wherein the second phase shifting element is connected in a signal path between the second end of the loop and the third port of the circulator component.

In a third aspect, a circulator system according to a first aspect, further comprising: a first impedance connected in the first signal path between the first port of the circulator and the transmitter port of the circulator system; a second impedance connected in a third signal path between the second port of the circulator and the antenna port of the circulator system; and a third impedance connected in the second signal path between the third port of the circulator and the receiver port of the circulator system.

In a fourth aspect, a circulator system according to a third aspect, wherein the first impedance is connected in a signal path between the first end of the loop and the first port of the circulator component; and wherein the third impedance is connected in a signal path between the second end of the loop and the third port of the circulator component.

In a fifth aspect, a circulator system according to a third aspect, wherein the first impedance is connected in a signal path between the first end of the loop and the transmitter port of the circulator system; and wherein the third impedance is connected in a signal path between the second end of the loop and the receiver port of the circulator system.

In a sixth aspect, a circulator system according to a fifth aspect, further comprising: a fourth impedance connected in a signal path between the first end of the loop and the first port of the circulator component; and a fifth impedance connected in a signal path between the second end of the loop and the third port of the circulator component In a seventh aspect, a circulator system according to a sixth aspect, further comprising: a sixth impedance connected in a signal path between the second port of the circulator component and the antenna port of the circulator system.

In an eighth aspect, a circulator system according to a third aspect, wherein at least one of the first impedance and the second impedance and the third impedance includes at least one of an inductor, a capacitor, a resistor, and a diode.

In a ninth aspect, a circulator system according to a first aspect, further comprising: a second loop having a second loop impedance, the second loop having first end connected to the first signal path and having a second end connected to the second signal path; a third phase shifting element connected in a signal path between the first end of the first loop and the first end of the second loop; and a fourth phase shifting element connected in a signal path between the second end of the first loop and the second end of the second loop.

In a tenth aspect, a method for isolating a transmitter signal from a receiver signal in a simultaneous transmit and receive system, comprising: receiving a signal to be transmitted at a transmitter port; phase shifting the signal to be transmitted by a first phase shift; transferring the phase shifted signal to be transmitted from a first port of a circulator to a second port of the circulator; transmitting the transferred phase shifted signal to be transmitted from an antenna; receiving a receiving signal at the antenna; transferring the receiving signal from the second port of the circulator to a third port of the circulator; phase shifting the transferred receiving signal by a second phase shift; connecting the signal to be transmitted to the phase shifted transferred receiving signal through a loop impedance; and outputting the phase shifted transferred receiving signal at a receiver port.

In an eleventh aspect, an method according to a tenth aspect, wherein the transmitting and the receiving occur simultaneously.

In a twelfth aspect, an method according to a tenth aspect, further comprising: phase shifting the phase shifted signal to be transferred by a third phase shift prior to the transferring of the phase shifted signal to be transferred from the first port to the second port; phase shifting the transferred receiving signal by a fourth phase shift before the phase shifting by the second phase shift; and connecting the phase shifted signal to be transferred that has been phase shifted by the first phase shift to the phase shifted transferred receiving signal that has been phase shifted by the fourth phase shift via a second loop impedance.

In a thirteenth aspect, a method according to a tenth aspect, further comprising: pre-conditioning the phase shifted signal to be transmitted prior to the transferring from the first port to the second port with a first impedance; pre-conditioning the receiving signal prior to the transferring from the second port to the third port with a second impedance; and pre-conditioning the receiving signal after the transferring from the second port to the third port with a third impedance.

In a fourteenth aspect, a method according to a thirteenth aspect, further comprising: impedance matching the transmitter port; impedance matching the antenna; and impedance matching the receiver port.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

We claim:

1. A circulator system for a simultaneous transmit and receive system, comprising:
   a transmitter port and an antenna port and a receiver port of the circulator system;
   a circulator component having a first port and a second port and a third port, the circulator being operable to carry signals from the first port to the second port and being operable to carry signals from the second port to the third port;
   a first phase shifting element connected in a first signal path between the first port and the transmitter port, the first phase shifting element being operable to apply a first phase shift to signals carried on the first signal path;
   a second phase shifting element connected in a second signal path between the third port and the receiver port, the second phase shifting element being operable to apply a second phase shift to signals carried on the second signal path;

a loop including a loop impedance, the loop having a first end connected to the first signal path and a second end connected to the second signal path;
a first impedance connected in the first signal path between the first port of the circulator and the transmitter port of the circulator system;
a second impedance connected in a third signal path between the second port of the circulator and the antenna port of the circulator system; and
a third impedance connected in the second signal path between the third port of the circulator and the receiver port of the circulator system.

2. A circulator system as claimed in claim 1, wherein the first impedance is connected in a signal path between the first end of the loop and the first port of the circulator component; and
wherein the third impedance is connected in a signal path between the second end of the loop and the third port of the circulator component.

3. A circulator system as claimed in claim 1, wherein the first impedance is connected in a signal path between the first end of the loop and the transmitter port of the circulator system; and
wherein the third impedance is connected in a signal path between the second end of the loop and the receiver port of the circulator system.

4. A circulator system as claimed in claim 3, further comprising:
a fourth impedance connected in a signal path between the first end of the loop and the first port of the circulator component; and
a fifth impedance connected in a signal path between the second end of the loop and the third port of the circulator component.

5. A circulator system as claimed in claim 4, further comprising:
a sixth impedance connected in a signal path between the second port of the circulator component and the antenna port of the circulator system.

6. A circulator system as claimed in claim 1, wherein at least one of the first impedance and the second impedance and the third impedance includes at least one of an inductor, a capacitor, a resistor, and a diode.

7. A circulator system for a simultaneous transmit and receive system, comprising:
a transmitter port and an antenna port and a receiver port of the circulator system;
a circulator component having a first port and a second port and a third port, the circulator being operable to carry signals from the first port to the second port and being operable to carry signals from the second port to the third port;
a first phase shifting element connected in a first signal path between the first port and the transmitter port, the first phase shifting element being operable to apply a first phase shift to signals carried on the first signal path;
a second phase shifting element connected in a second signal path between the third port and the receiver port, the second phase shifting element being operable to apply a second phase shift to signals carried on the second signal path;
a loop including a loop impedance, the loop having a first end connected to the first signal path and a second end connected to the second signal path;
a second loop having a second loop impedance, the second loop having first end connected to the first signal path and having a second end connected to the second signal path;
a third phase shifting element connected in a signal path between the first end of the first loop and the first end of the second loop; and
a fourth phase shifting element connected in a signal path between the second end of the first loop and the second end of the second loop.

8. A method for isolating a transmitter signal from a receiver signal in a simultaneous transmit and receive system, comprising:
receiving a signal to be transmitted at a transmitter port;
phase shifting the signal to be transmitted by a first phase shift;
transferring the phase shifted signal to be transmitted from a first port of a circulator to a second port of the circulator;
transmitting the transferred phase shifted signal to be transmitted from an antenna;
receiving a receiving signal at the antenna;
transferring the receiving signal from the second port of the circulator to a third port of the circulator;
phase shifting the transferred receiving signal by a second phase shift;
connecting the signal to be transmitted to the phase shifted transferred receiving signal through a loop impedance;
outputting the phase shifted transferred receiving signal at a receiver port;
phase shifting the phase shifted signal to be transferred by a third phase shift prior to the transferring of the phase shifted signal to be transferred from the first port to the second port;
phase shifting the transferred receiving signal by a fourth phase shift before the phase shifting by the second phase shift; and
connecting the phase shifted signal to be transferred that has been phase shifted by the first phase shift to the phase shifted transferred receiving signal that has been phase shifted by the fourth phase shift via a second loop impedance.

9. A method for isolating a transmitter signal from a receiver signal in a simultaneous transmit and receive system, comprising:
receiving a signal to be transmitted at a transmitter port;
phase shifting the signal to be transmitted by a first phase shift;
transferring the phase shifted signal to be transmitted from a first port of a circulator to a second port of the circulator;
transmitting the transferred phase shifted signal to be transmitted from an antenna;
receiving a receiving signal at the antenna;
transferring the receiving signal from the second port of the circulator to a third port of the circulator;
phase shifting the transferred receiving signal by a second phase shift;
connecting the signal to be transmitted to the phase shifted transferred receiving signal through a loop impedance;
outputting the phase shifted transferred receiving signal at a receiver port;
pre-conditioning the phase shifted signal to be transmitted prior to the transferring from the first port to the second port with a first impedance;

pre-conditioning the receiving signal prior to the transferring from the second port to the third port with a second impedance; and
pre-conditioning the receiving signal after the transferring from the second port to the third port with a third impedance.

10. A method as claimed in claim 9, further comprising:
impedance matching the transmitter port;
impedance matching the antenna; and
impedance matching the receiver port.

* * * * *